United States Patent [19]

Taylor et al.

[11] Patent Number: 5,528,153
[45] Date of Patent: Jun. 18, 1996

[54] METHOD FOR NON-DESTRUCTIVE, NON-CONTACT MEASUREMENT OF DIELECTRIC CONSTANT OF THIN FILMS

[75] Inventors: Kelly J. Taylor, Plano; Wei-Yung Hsu, Dallas, both of Tex.

[73] Assignee: Texas Instruments Incorporated, Dallas, Tex.

[21] Appl. No.: 335,030

[22] Filed: Nov. 7, 1994

[51] Int. Cl.$^6$ .................................................. G01R 27/26
[52] U.S. Cl. ............................................ 324/671; 324/663
[58] Field of Search ..................................... 324/661, 662, 324/663, 671

[56] References Cited

U.S. PATENT DOCUMENTS

| | | | |
|---|---|---|---|
| 3,801,900 | 4/1974 | Szasz | 324/671 |
| 4,910,453 | 3/1990 | Abbe et al. | 324/663 |

*Primary Examiner*—Kenneth A. Wieder
*Assistant Examiner*—Glenn W. Brown
*Attorney, Agent, or Firm*—John D. Crane; James C. Kesterson; Richard L. Donaldson

[57] ABSTRACT

A method for measurement of dielectric constant of a thin film is disclosed which is non-destructive and avoids contact with the film and the substrate carrying it. A first characteristic of the substrate is measured using a capacitance measuring device. Then, the thin film is deposited on the substrate. The first characteristic of the substrate is measured a second time after the film has been deposited. Thereafter, the true film thickness is measured. A ratio of the measurements made with the capacitance measuring device is then established with the actual thickness measurement. The dielectric constant can then be derived from a lookup table or graph calibrated for the tools being used for the measurements.

4 Claims, 1 Drawing Sheet

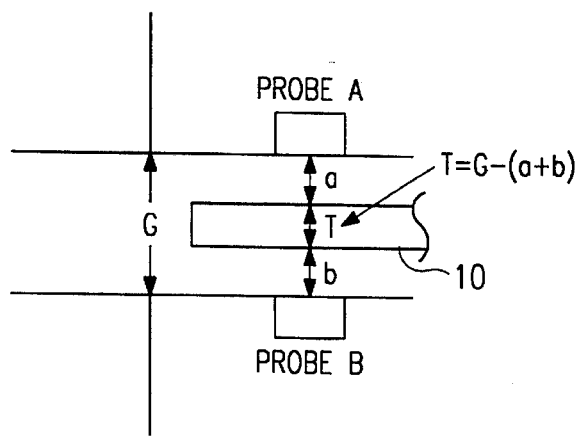
FIG. 1
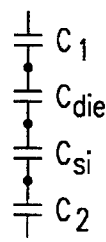
FIG. 2
FIG. 3
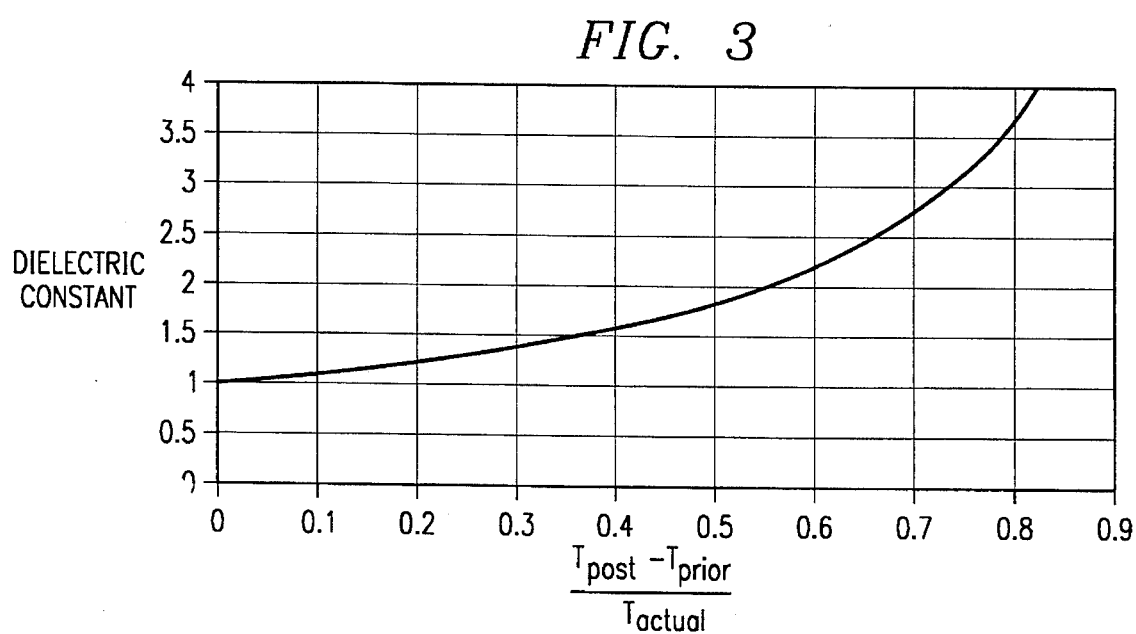

METHOD FOR NON-DESTRUCTIVE, NON-CONTACT MEASUREMENT OF DIELECTRIC CONSTANT OF THIN FILMS

FIELD OF THE INVENTION

This invention relates generally to the field of measurement of dielectric constant for materials and more particularly to the measurement of dielectric constant for materials used in the manufacture of semiconductor chips and the like.

BACKGROUND OF THE INVENTION

With the advent of ever smaller geometries used in the manufacture of advanced VLSI components, the capacitance which occurs between adjacent metal connecting leads becomes greater. This increased capacitance leads to increased time delay for signals transmitted over these leads. It also contributes to greater power consumption by the chip and to cross talk between lines. Accordingly, designers have recognized that reducing the capacitance between closely adjacent conducting lines will have a significant effect on circuit performance. This can only be accomplished by changes in geometry of the physical layout of conductors in the chip or by decreasing the dielectric constant of the material which fills the space between adjacent lines. For this reason much research into low dielectric materials is underway in many laboratories around the world.

Measurement of the dielectric constant K for a material is usually performed by fabricating metal-insulator-semiconductor (MIS) capacitors. Once formed, the capacitors are contact probed at a testing station to measure K. This fabrication and probing is not a trivial process. For accurate determination of K, both the area of the metal electrode and the dielectric thickness underneath the electrode must be known. Use of shadow masks and direct lithography are the methods best suited to controlling the area. However, to assure high accuracy, the area of the metal electrode is also measured for each capacitor being measured. Optical ellipsometry or reflectometry is then used to determine film thickness. Accordingly, this technique is neither fast, non-destructive nor inexpensive.

Once the metal electrode for the capacitor is formed, the structure is permanent in that any etch which might be performed to remove the electrode may alter the dielectric's characteristics. The dielectric thus is disposed under a metal electrode and is not accessible for further evaluation or research. Therefore, measurement of the dielectric constant K with a MIS capacitor is considered to be a destructive technique.

Another common technique used for measuring the dielectric constant of a thin film is to use a mercury probe. In this method, a conductive column of mercury is put on the thin film and the capacitance is measured directly. This method is destructive inasmuch as mercury is considered a contaminant in most semiconductor processing facilities. Expensive handling and disposal laws and regulations contribute added cost for using this alternative dielectric measurement method.

Mercury probes, in addition, are inherently inaccurate due to a fundamental problem with the way mercury adheres to a surface. The surface which the mercury probe contacts on the thin film depends on the material characteristics of the interface between the thin film and the column of mercury. Different thin films will cause the surface area to have a different size, and, unless the difficult area measurements are made for the mercury probe, the data cannot be any more reliable than the error in the surface area. Thus mercury probes for dielectric constant measurement is expensive, destructive and inaccurate.

In view of the above mentioned and other problems associated with the known approaches for measuring dielectric constant, it is the principal objective of the present invention to provide a method for measuring dielectric constant which is suitable for use in connection with manufacturing semiconductor chips and the like.

It is a further objective of the invention to provide a non-contact method of measuring dielectric constant where there is no contact between instrument probes and the wafer.

It is still further an objective of this invention to provide a non-destructive method for measuring dielectric constant.

BRIEF DESCRIPTION OF THE INVENTION

In achieving the above mentioned and other objects, advantages and features of this invention, a non-contact capacitive probe based on parallel-plate capacitor theory is used to measure the thickness of the wafer. Adding a dielectric film to the substrate will change the measured thickness. The effective thickness of the substrate plus the film as measured by the capacitive gage is not a true thickness because the probe is affected by the dielectric constant of the film. The true film thickness is then measured using ellipsometry. From these measurements, the actual dielectric constant can be determined.

BRIEF DESCRIPTION OF THE DRAWINGS

In achieving the above and other objects, advantages and features of this invention, the invention is described in connection with the drawings wherein:

FIG. 1 illustrates the parallel electrodes of a capacitive sensing tool used in measuring the thickness of the wafer either with or without a dielectric coating;

FIG. 2 illustrates the capacitance measured by an ADE 9500 in determining the thickness of a film coated wafer; and FIG. 3 is a graph of the ratio of various thickness measurements and the corresponding dielectric constant K for values of K between 1 and about 4.

DETAILED DESCRIPTION

A method for measuring the dielectric constant K of a film of dielectric material deposited on a silicon wafer according to the present invention combines measurements made with a non contact capacitive sensing tool with measurements made with an optical thickness measuring tool such as a spectral ellipsometer. In the case of either tool, no contact between the tool probe and the wafer occurs.

A simplified illustration of the probes used in a capacitive sensing tool is illustrated in part in FIG. 1. The tool utilizes an upper probe, probe A which is disposed above and spaced from a lower probe, probe B. The distance between the probes is the distance G. A silicon wafer 10 is disposed between probe A and probe B. The wafer 10 is substantially planar and has a thickness of T. The wafer 10 is preferably located approximately midway between probe A and probe B such that the plane of the wafer 10 is perpendicular to a line drawn between the lower face of probe A and the upper face of probe B. As illustrated, the upper surface of the wafer 10 is located a distance "a" below the lower face of probe A and the lower surface of the wafer 10 is at a distance "b"

above the upper face of probe B. As a consequence, the thickness of the wafer 10 can be expressed by the following equation:

$$T=G-(a+b)$$

One capacitive tool utilizing a probe arrangement such as illustrated in FIG. 1 is the ADE 9500 UltraGage manufactured by ADE Corporation, Newton, Mass. The tool operates on parallel-plate capacitor theory. This implies that if parallel plates are driven with a constant a.c. current, the measured voltage across the electrodes is proportional to the distance separating the electrodes. If the distances a and b are subtracted from the gap G as illustrated in the above equation, the thickness of the wafer 10 at the point of measurement can be calculated.

The above described capacitive thickness measuring tool is utilized to measure the thickness of the wafer 10 in the manner specified by the maker of the tool. It is understood that other tools that utilize capacitor theory to measure thickness can also be used in the method of the present invention. Once the wafer thickness $T_{prior}$ is known, then the dielectric film is deposited on the wafer and the thickness again measured. The measured thickness $T_{post}$, however, is not the true thickness because the capacitive thickness measuring tool is affected by the dielectric constant of the film deposited on the wafer. This effect is best understood in connection with FIG. 2. The total capacitance measured by the tool is comprised of four capacitors in series. The first capacitor $C_1$ comprises the capacitance of the gap between the upper probe A and the upper surface of the coated wafer. The gap may comprise an air gap or a vacuum or a gap filled with an inert gas such as helium or nitrogen or other inert gases. The second capacitor $C_{die}$ comprises the capacitance of the film on the upper surface of the silicon wafer 10. The third capacitor $C_{si}$ comprises the capacitance of the wafer. The fourth capacitor $C_2$ comprises the capacitance of the air gap between the lower surface of the wafer and the probe B. The total capacitance $C_T$ that is measured by the tool is calculated from the following equation:

$$1/C_T=1/C_1+1/C_{die}+1/C_{si}+1/C_2$$

Since the total capacitance $C_T$ is in part determined by $C_{die}$ and the capacitance $C_{die}$ is a function of the dielectric constant of the film, the total thickness of the wafer plus the film as measured by the above mentioned tool is not a completely accurate measurement. Clearly, the difference between the measured thickness $T_{post}$ and the true thickness is a function of the dielectric constant of the film.

In view of the above analysis, a true thickness $T_{actual}$ measurement of the dielectric film is needed. The true thickness can be measured using a spectral ellipsometer such as a SOPRA model E4G.

Once the thickness prior to film deposition $T_{prior}$, the thickness after film deposition $T_{post}$ and the actual thickness of the film $T_{actual}$ have been measured, the dielectric constant can be calculated using the following formula:

$$K=[1-\alpha(T_{post}-T_{prior})/T_{actual}]^{-1}$$

where $\alpha$ is a constant greater than zero and less than or equal to 1.

The constant $\alpha$ is determined by measuring known samples by the method described and calculating the constant $\alpha$ which makes the above equation true. $\alpha$ will generally be close to 1.0 which can be seen by solving the equation $$1/C_T=1/C_1+1/C_{die}+1/C_{si}+1/C_2$$

for parallel plate capacitors. The solution is $\alpha=(K_{si}-1)/K_{si}$ and $K_{si}$ is approximately equal to 12 from dc to $10^{15}$ Hz. Therefore, $\alpha=11/12$ which is approximately 0.91

In view of the above equation, it is possible to use a graph or lookup table to determine the dielectric constant for a film from just the measurement of the quantity $(T_{post}-T_{prior})/T_{actual}$ provided $\alpha$ is known. $\alpha$ would be once determined by calibrating this method with a set of films with known dielectric constants, FIG. 3 illustrates a graph with $\alpha=0.9145$ which can be used to determine the dielectric constant from measurement of the term $(T_{post}-T_{prior})/T_{actual}$ where the dielectric constant is between 1 and about 4. For higher values of K, the curve turns sharply upwardly and the resulting accuracy of the method for determining K diminishes. Accordingly, the present method is deemed most useful for measurement of dielectric constants in the range of between 1 and about 4. As such, this method for measuring dielectric constant is particularly suitable for measuring the dielectric constant of materials being used between closely adjacent metal lines in a semiconductor product where a dielectric constant K less than that of silicon dioxide is desired in order to reduce the capacitance between closely adjacent metal lines.

The above described method for determining dielectric constant for a thin film of a dielectric material has been verified to be operative for films having a thickness in the range of from 0.5 to 4 microns. Due to the nature of the measurements and calculations made thereon, the method will function for even thicker films than those which were used in the verification of the method. However, as the films become thinner, the method becomes inherently less accurate as the film thickness becomes smaller.

While the above description has been directed to a method for measuring low dielectric constant of thin films in the range of 1 to about 4, those skilled in the art will recognize that the method can also be utilized in connection with measuring dielectric constants greater than 4. In this situation, two modifications would be done to maintain the same level of accuracy and precision as the case when K is between 1 and 4. The first modification would be to increase the dielectric constant of the substrate wafer which, for example, could be done by doping a silicon wafer or coating it with a conductive metal film. Secondly, the volume occupied by air (or vacuum or inert gas) between the probes would be replaced with an appropriate high dielectric constant fluid which can be either a liquid or a gas. Since this fluid by necessity would contact the wafer, care would be given to choose a fluid which would not destroy the material properties of the dielectric film being measured, and could also easily be removed from the dielectric thin film. The same measurements would be made as described above, that is, the true thickness of the film would be measured as above and the results utilized in the equation for calculating the dielectric constant K.

The above description has concentrated on the method of calculating the dielectric constant of a thin film using a capacitive measurement based tool for measuring thickness, namely the ADE 9500. Those of skill in the art will recognize, however, that if the ADE tool or other tool provided a measure of capacitance as an output as opposed to thickness which is provided, the dielectric constant can also be calculated therefrom. This alternative approach, however, requires a somewhat different formula although the measurements taken are related to those taken in the above described method. In this alternative approach, a capacitive measuring tool is used to measure the capacitance $C_i$ of the air gaps and the wafer 10 between the probes A and B and prior to film deposition as illustrated in FIG. 1. Then, the thin film is deposited on the wafer 10 and the capacitance $C_f$ between probes A and B is measured. Thereafter, the true dielectric thickness $t_d$ is measured using a spectral ellipsometer or other instrument for measuring film thickness. The dielectric constant K can then be calculated using the following formula.

$$K=[1-\beta(C_f-C_i)/C_f C_i t_d]^{-1}$$

where $\beta$ is a constant equal to the distance between the probes multiplied by the capacitance with nothing disposed between the probes.

$C_f$ is the capacitance measured between the probes with a wafer having a thin film deposited thereon.

$C_i$ is the capacitance measured between the probes prior to film deposition.

$t_d$ is the true thickness of the dielectric.

As noted with the first described method for determining dielectric constant, the immediately preceding method which relies on measuring capacitance can also be used in connection with a calibrated graph or lookup table to determine K. In this case, however, the quantity on the X axis of the graph would be $(C_f-C_i)/C_f C_i t_d$.

While the above description has been made in connection with the drawings and specific instruments in mind, those of skill in the art will recognize that there are many possible modifications to the method described herein which can be made without departing from the spirit and scope of the invention as defined by the following claims.

What is claimed is:

1. A method for non-contact, non-destructive measuring of the dielectric constant of a thin film on a semiconductor wafer comprising the steps of:

(a) measuring a first characteristic of said wafer using a capacitance measuring tool;

(b) depositing a thin film of a dielectric material on said wafer;

(c) measuring said first characteristic of said wafer with said thin film deposited thereon using a capacitance measuring tool;

(d) measuring the true thickness of said thin film; and (e) forming a ratio of said measurement in step c minus the measurement in step a divided by the measurement in step d and deriving the dielectric constant for said deposited thin film from a calibrated table as a function of said ratio.

2. A method for non contact, nondestructive measuring of the dielectric constant of a thin film on a semiconductor wafer comprising the steps of:

placing a wafer between the probes of a capacitive measuring tool and measuring the capacitance $C_i$ therebetween;

placing a thin film of a dielectric on said wafer;

placing the film coated wafer between the probes of a capacitive measuring tool and measuring the capacitance $C_f$ therebetween;

measuring the true thickness $t_d$ of the film deposited on the wafer; and calculating the dielectric constant for said thin film using the formula $$K=[1-\beta(C_f-C_i)/C_f C_i t_d]^{-1}$$

where $\beta$ is a constant which has been determined by experiment to validate said formula for the tools utilized to make said measurements.

3. A method for non-contact, nondestructive measuring of the dielectric constant of a thin film on a semiconductor wafer comprising the steps of:

measuring the thickness of said wafer $T_{prior}$ using a capacitance measuring tool;

depositing a thin film of a dielectric material on said wafer;

measuring the thickness of said wafer with said thin film thereon $T_{post}$ using a capacitance measuring tool;

measuring the true thickness $T_{actual}$ of said thin film thereon; and calculating the dielectric constant for said thin film using the formula $$K=[1-\alpha(T_{post}-T_{prior})/T_{actual}]^{-1}$$

where $\alpha$ is a constant greater than zero and less than or equal to 1 which has been determined by experiment to validate said formula for the tools utilized to make said measurements.

4. The method of claim 3 wherein $\alpha$ is approximately 0.91.

* * * * *